(12) United States Patent
Tanaka (10) Patent No.: US 7,948,603 B2
(45) Date of Patent: May 24, 2011

(54) VACUUM DEVICE, OPERATION METHOD FOR VACUUM DEVICE, EXPOSURE SYSTEM, AND OPERATION METHOD FOR EXPOSURE SYSTEM

(75) Inventor: Keiichi Tanaka, Saitama (JP)

(73) Assignee: Nikon Corporation, Tokyo (JP)

( * ) Notice: Subject to any disclaimer, the term of this patent is extended or adjusted under 35 U.S.C. 154(b) by 1056 days.

(21) Appl. No.: 10/569,167

(22) PCT Filed: Aug. 17, 2004

(86) PCT No.: PCT/JP2004/012130
§ 371 (c)(1),
(2), (4) Date: Oct. 24, 2006

(87) PCT Pub. No.: WO2005/022613
PCT Pub. Date: Mar. 10, 2005

(65) Prior Publication Data
US 2007/0199201 A1    Aug. 30, 2007

(30) Foreign Application Priority Data

Aug. 27, 2003  (JP) ................................. 2003-302780
Jan. 26, 2004  (JP) ................................. 2004-016646

(51) Int. Cl.
*G03B 27/52* (2006.01)
(52) U.S. Cl. ............ 355/30; 417/62; 355/53; 250/504 R
(58) Field of Classification Search .................... 355/30; 378/34; 62/55.5; 417/3, 62, 901; 250/492.2, 250/504 R
See application file for complete search history.

(56) References Cited

U.S. PATENT DOCUMENTS 3,226,467 A * 12/1965 Kienel et al. .................... 174/18
(Continued)

FOREIGN PATENT DOCUMENTS

JP     61-291965 A    12/1986
(Continued)

OTHER PUBLICATIONS

Japanese Office Action dated Jan. 8, 2009 (and English translation thereof) in counterpart Japense Application No. 2004-016646.

*Primary Examiner* — Hung Henry Nguyen
*Assistant Examiner* — Steven H Whitesell-Gordon
(74) *Attorney, Agent, or Firm* — Holtz, Holtz, Goodman & Chick, PC (57) ABSTRACT

The exposure apparatus 100 comprises a double shell structure which has an upper vacuum chamber 140 on the outside of the reticle chamber 135, and a lower vacuum chamber 160 on the outside of the wafer chamber 155. A cryo pump CP and a turbo molecular pump TMP/dry pump DP are connected in parallel to each of the chambers, i.e., the reticle chamber 135 and wafer chamber 155. During exposure operation and alignment of the exposure apparatus 100, only the cryo pump CP (vibration-free type vacuum pump) is operated; the turbo molecular pump TMP/dry pump DP (vibrating type vacuum pump) is stopped. As a result, it is possible to cut off the transmission of vibration from the vibrating type vacuum pump during exposure operation and alignment of the exposure apparatus, so that the precision of the stage devices 137 and 157 can be ensured to a much greater degree; accordingly, deterioration of the exposure performance can be reduced to a much greater extent.

8 Claims, 6 Drawing Sheets

U.S. PATENT DOCUMENTS

| | | | |
|---|---|---|---|
| 5,002,464 A * | 3/1991 | Lee | 417/152 |
| 5,267,292 A * | 11/1993 | Tanaka et al. | 378/34 |
| 6,031,598 A * | 2/2000 | Tichenor et al. | 355/67 |
| 6,288,357 B1 * | 9/2001 | Dyer | 219/121.41 |
| 6,333,775 B1 * | 12/2001 | Haney et al. | 355/30 |
| 7,274,431 B2 * | 9/2007 | Box et al. | 355/30 |
| 2001/0035942 A1 | 11/2001 | Hara et al. | |
| 2003/0016780 A1 * | 1/2003 | Matsuo et al. | 378/34 |

FOREIGN PATENT DOCUMENTS

| | | |
|---|---|---|
| JP | 2000-223757 A | 8/2000 |
| JP | 2001-345262 A | 12/2001 |
| JP | 2003-071394 A | 3/2003 |
| JP | 2003-282423 A | 10/2003 |
| WO | WO 0122480 A1 * | 3/2001 |

* cited by examiner

VACUUM DEVICE, OPERATION METHOD FOR VACUUM DEVICE, EXPOSURE SYSTEM, AND OPERATION METHOD FOR EXPOSURE SYSTEM

This application is a U.S. National Phase Application under 35 USC 371 of International Application PCT/JP2004/012130 filed Aug. 17, 2004.

TECHNICAL FIELD

The present invention relates to a vacuum apparatus equipped with components such as a stage apparatus that are operated in a vacuum, an exposure apparatus which transfers a pattern formed on an original plate onto a sensitive substrate using energy radiation such as EUV light (extreme ultraviolet light), and operating methods for these apparatuses.

BACKGROUND ART

In recent years, as semiconductor integrated circuits have become progressively finer, projection lithography techniques using EUV light which has a wavelength of approximately 13 nm have been developed in order to increase the resolving power of optical systems, which is limited by the diffraction limit of light. Such EUV exposure apparatuses comprise a lens barrel which accommodates a projection optical system that projects the pattern on the original plate onto the sensitive substrate, an original plate stage which moves and positions the original plate, a sensitive substrate stage which moves and positions the sensitive substrate, and the like. These components such as stages are generally installed inside a vacuum chamber in order to prevent absorption of the EUV light by air. A vacuum pump that is used to generate a vacuum, and piping that is used to accommodate electrical cables, an exhaust pipe, and the like are connected to this vacuum chamber.

When the vacuum pump is operated so that a vacuum is generated inside the vacuum chamber, static and dynamic deformation occur in the vacuum chamber due to the effects of vibration of the pump itself and fluctuations in the atmospheric pressure. Consequently, such deformation of the vacuum chamber is transmitted to the components such as stages, and thus causes a deterioration in the exposure performance (stage synchronization precision, aberration, variation in performance values, and the like).

Meanwhile, in a high-vacuum environment, if the piping is made of a synthetic resin, gases that have a broad range of molecular weights are emitted. Accordingly, such synthetic resin piping is undesirable. Consequently, a material which has a low gas permeability and a relatively high rigidity must be used as the material of the piping. However, since piping consisting of a material that has a high rigidity has a large bending radius, the piping layout design inside the apparatus is restricted, so that it is difficult to realize desired apparatus specifications. Furthermore, if the piping has a high rigidity, the vibration of the vacuum pump and the like is easily transmitted to the apparatus units (stage system and optical system) via the piping, so that there is a danger that the exposure performance will also be caused to deteriorate by the effects of this vibration.

DISCLOSURE OF THE INVENTION

The present invention was devised in light of such circumstances; it is an object of the present invention to provide [i] a vacuum apparatus and exposure apparatus which offer the advantage of making it possible to suppress deformation of the chamber and the transmission of vibration to the stages and the like, so that the amount of deterioration in the exposure performance can be reduced, and the advantage of facilitating the realization of desired apparatus specifications, and [ii] operating methods for these apparatuses.

The first invention that is used to achieve the object described above is a vacuum apparatus comprising a plurality of components that are operated in a vacuum, a plurality of inner chambers that respectively accommodate these individual components, bellows that connect these respective inner chambers, an outer chamber that accommodates the plurality of inner chambers as a whole, and exhaust means installed in the respective inner chambers and the outer chamber.

In this vacuum apparatus, a double shell structure is used in which the inner chambers as a whole are accommodated in an outer chamber. Accordingly, even when a vacuum is generated, or when there are fluctuations in the atmospheric pressure, the differential pressure between the insides and outside of the inner chambers can be caused to approach zero. Consequently, the apparatus can be devised so that the deleterious effects of chamber deformation do not reach the components inside the inner chambers, thus making it possible to ensure the precision of the components. If such a double shell structure is used, there is likewise no need to design the outer chamber member so that this member can handle a high vacuum; accordingly, this also contributes to a reduction in the cost of the apparatus. Furthermore, contamination countermeasures can also be facilitated by setting the insides of the inner chambers at a higher vacuum than the inside of the outer chamber.

The second invention that is used to achieve the object described above is the first invention, wherein this apparatus has piping that runs to the outside of the apparatus from the inner chambers, and the portions of this piping that reach the outer chamber from the inner chambers consist of a thin, flexible piping material.

In the present invention, the piping (vacuum exhaust pipe and the like) consists of a thin, flexible piping material; accordingly, the force and vibration applied to the inner chambers from the piping can be reduced. As a result, the deformation and vibration of the inner chambers can be reduced, so that the precision of the components can be ensured to a much greater degree. Furthermore, in cases where the piping is vacuum exhaust piping, since the internal and external pressure difference of the piping between the inner chambers and outer chamber is small, a state in which crushing results from the differential pressure can be avoided even if the piping material is a thin, flexible piping material. Furthermore, since such a piping material can be used, the degree of freedom in the layout design of the piping inside the apparatus is increased, so that the desired apparatus specifications can be realized more easily.

The third invention that is used to achieve the object described above is the first invention or second invention, wherein the exhaust means installed in the inner chambers has a vibration-free type vacuum pump and a vibrating type vacuum pump that are installed in parallel.

In the vacuum apparatus of the present invention, since the exhaust means installed in the inner chambers has a vibration-free type vacuum pump and a vibrating type vacuum pump that are installed in parallel, the apparatus can be devised so that either both pumps are operated, or so that the vibrating type pump is operated, until the insides of the inner chambers reach a high-vacuum state, thus allowing the quick realization of a high-vacuum state, after which only the vibration-free vacuum pump is operated during the subsequent operation of the components, as in the sixth invention described later. In this case, the transmission of vibration from the pump during the operation of the components can be reduced, so that the precision of the components can be ensured to an even greater degree. Furthermore, it is desirable that a pulse tube type cryo pump be used as the vibration-free vacuum pump.

The fourth invention that is used to achieve the object described above is the first invention, wherein the exhaust means installed in the inner chambers has a low-vibration type vacuum pump that exhausts the gas in the inner chambers into the outer chamber, and an opening-and-closing valve that connects the inner chambers and the outer chamber.

In the present invention, an operating method such as that used in the seventh invention described later can be used, thus making it possible to obtain an operating effect similar to that of the third invention by means of a construction simpler than that of the third invention. Furthermore, it is desirable to use a turbo molecular pump as a low-vibration type vacuum pump. Moreover, the term "low-vibration type vacuum pump" used in the present specification and claims naturally includes vibration-free type vacuum pumps. In this case, it is desirable to use a pulse tube type cryo pump.

The fifth invention that is used to achieve the object described above is the third invention or fourth invention, wherein the respective components and the vibration-free type vacuum pump inside the inner chambers are in a positional relationship which is such that these parts do not face each other, a heat-blocking plate is disposed between these components and the vibration-free type vacuum pump inside the inner chambers, and the surface of this heat-blocking plate on the side of the components is a mirror-finish metal surface.

In this invention, the radiation of the heat of cooling from the pump to the components can be prevented by the heat-blocking plate.

The sixth invention that is used to achieve the object described above is an operating method for the vacuum apparatus constituting the third invention, wherein only the vibration-free type vacuum pump is operated during the operation of the components.

In this invention, as was described in the description of the third invention, the transmission of vibration from the pump can be reduced during the operation of the components; accordingly, the precision of the components can be ensured to a much greater degree.

The seventh invention that is used to achieve the object described above is an operating method for the vacuum apparatus constituting the fourth invention, wherein in the exhaust of the gas inside the inner chambers, the opening-and-closing valve is first placed in an open state, and the gas inside the inner chambers and the gas inside the outer chamber are simultaneously exhausted by the exhaust means disposed in the outer chamber, so that the degree of vacuum is heightened, after which the opening-and-closing valve is closed, the low-vibration type vacuum pump is operated, and the exhaust of the gas inside the outer chamber is continued by the exhaust means installed in the outer chamber.

In the present invention, initially, the opening-and-closing valve is placed in an open state, and the gas inside the inner chambers and the gas inside the outer chamber are simultaneously exhausted by the exhaust means installed inside the outer chamber, so that the degree of vacuum is heightened; accordingly, the degree of vacuum can quickly be heightened. At the point in time at which the degree of vacuum has been sufficiently heightened, the opening-and-closing valve is closed, so that the inner chambers and outer chamber are separated; then, the exhaust of the outer chamber is performed by the exhaust means installed in the outer chamber, and the low-vibration type vacuum pump installed between the inner chambers and the outer chamber is operated so that the gas inside the inner chambers is exhausted into the outer chamber. Accordingly, since the transmission of vibration from the pump can be reduced during the operation of the components, the precision of the components can be ensured to a much greater degree.

The eighth invention that is used to achieve the object described above is an exposure apparatus comprising a lens barrel which accommodates a projection optical system that projects a pattern on an original plate onto a sensitive substrate, an original plate stage which moves and positions this original plate, a sensitive substrate stage which moves and positions the sensitive substrate, a plurality of inner chambers which respectively accommodate the original plate stage and the sensitive substrate stage, bellows which connect these respective inner chambers and the lens barrel, an outer chamber which accommodates the plurality of inner chambers and the lens barrel, and exhaust means installed in the respective inner chambers and the outer chamber.

In the present invention, since the apparatus has a double shell structure in which the inner chambers as a whole are accommodated in an outer chamber, the precision of the stages can be ensured, and the amount of deterioration in the exposure performance can be reduced, for the same reasons as those given in the description of the first invention.

The ninth invention that is used to achieve the object described above is the eighth invention, wherein the exhaust means installed in the inner chambers has a vibration-free type vacuum pump and a vibrating type vacuum pump that are installed in parallel.

In this invention, the transmission of vibration from the pump during the exposure operation and during alignment can be reduced for the same reasons as those given in the description of the third invention; accordingly, the precision of the stages can be ensured to a much greater degree, and the amount of deterioration in the exposure performance can be reduced to a much greater extent. Furthermore, it is desirable to use a pulse tube type cryo pump as the vibration-free type vacuum pump.

The tenth invention that is used to achieve the object described above is the eighth invention, wherein the exhaust means installed inside the inner chambers has a low-vibration type vacuum pump that exhausts the gas inside the inner chambers into the outer chamber, and an opening-and-closing valve that connects the inner chambers and the outer chamber.

This invention makes it possible to reduce the transmission of vibration from the pump during the exposure operation and during alignment for the same reasons as those given in the description of the fourth invention; accordingly, the precision of the stages can be ensured to a much greater degree, and the amount of deterioration in the exposure performance can be reduced to a much greater extent. Furthermore, it is desirable to use a turbo molecular pump as the low-vibration type vacuum pump. Moreover, in cases where a vibration-free type vacuum pump is used, it is desirable to use a pulse tube type cryo pump.

The eleventh invention that is used to achieve the object described above is any of the eighth through tenth inventions, wherein contamination removal means are installed in the respective inner chambers.

In this invention, contamination can be recovered using the contamination removal means (e.g., ionization device, ion pump, or the like); accordingly, the problem of a drop in reflectivity due to the adhesion of contaminants to the reflective mirrors and the like constituting the projection optical system inside the lens barrel can be made less likely to occur.

The twelfth invention that is used to achieve the object described above is the eighth invention, wherein the apparatus further comprises a body that supports the lens barrel, original plate stage and sensitive substrate stage on the building floor, and a stage measurement reference device attachment member that is supported on this body, and an anti-vibration stand is installed at least between the body and the building floor or between the body and the lens barrel.

In this invention, the vibration of the lens barrel can be reduced by the anti-vibration stand (e.g., active anti-vibration stand (abbreviated to AVIS)); accordingly, the vibration of members that support various parts inside and outside the lens barrel (e.g., mirrors, length gauges, stage measuring instruments, and the like) can be reduced. As a result, the precision of various parts can be ensured, so that the amount of deterioration in the exposure performance can be reduced.

The thirteenth invention that is used to achieve the object described above is an operating method for the exposure apparatus constituting the ninth invention, wherein only the vibration-free type vacuum pump is operated during the exposure operation and alignment of the exposure apparatus.

In this invention, for the same reasons as those given in the description of the sixth invention, the transmission of vibration from the pump to various parts inside and outside the lens barrel (e.g., mirrors, length gauges, stage measuring instruments, and the like) can be reduced during the exposure operation and alignment of the exposure apparatus; accordingly, the amount of deterioration in the exposure performance can be reduced.

The fourteenth invention that is used to achieve the object described above is an operating method for the tenth invention, wherein in the exhaust of the gas inside the inner chambers, the opening-and-closing valve is first placed in an open state, and the gas inside the inner chambers and the gas inside the outer chamber are simultaneously exhausted by the exhaust means disposed in the outer chamber, so that the degree of vacuum is heightened, after which the opening-and-closing valve is closed, the low-vibration type vacuum pump is operated, and the exhaust of the gas inside the outer chamber is continued by the exhaust means installed in the outer chamber.

In this invention, for the same reasons as described in the seventh invention, the transmission of vibration from the pump to various parts inside and outside the lens barrel (e.g., mirrors, length gauges, stage measuring instruments, and the like) can be reduced during the exposure operation and alignment of the exposure apparatus; accordingly, the amount of deterioration in the exposure performance can be reduced.

BEST MODE FOR CARRYING OUT THE INVENTION

Figure 1:
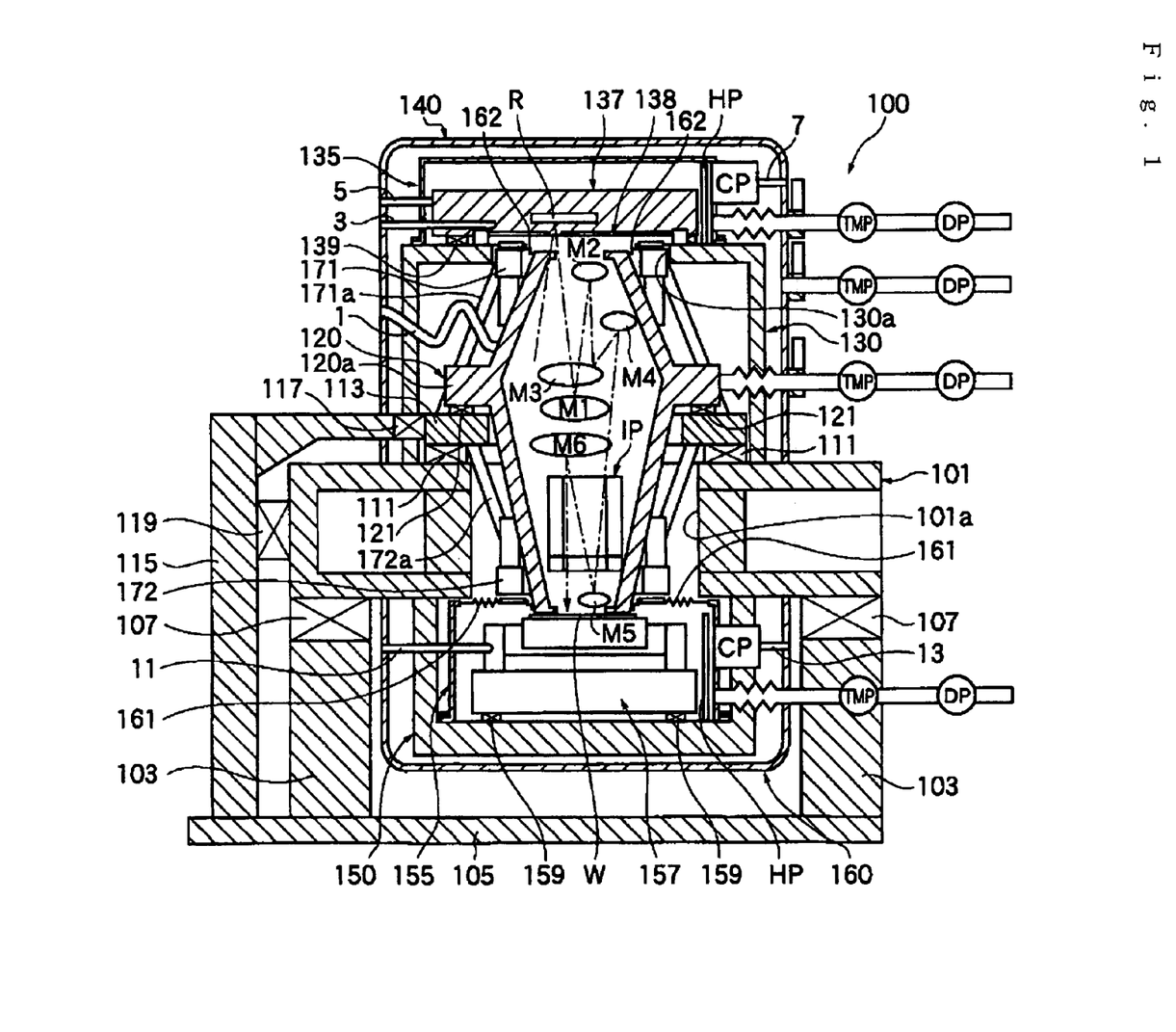
FIG. 1 is a sectional view illustrating an example of the mechanical structure of an exposure apparatus constituting one working configuration of the present invention.
Figure 2:
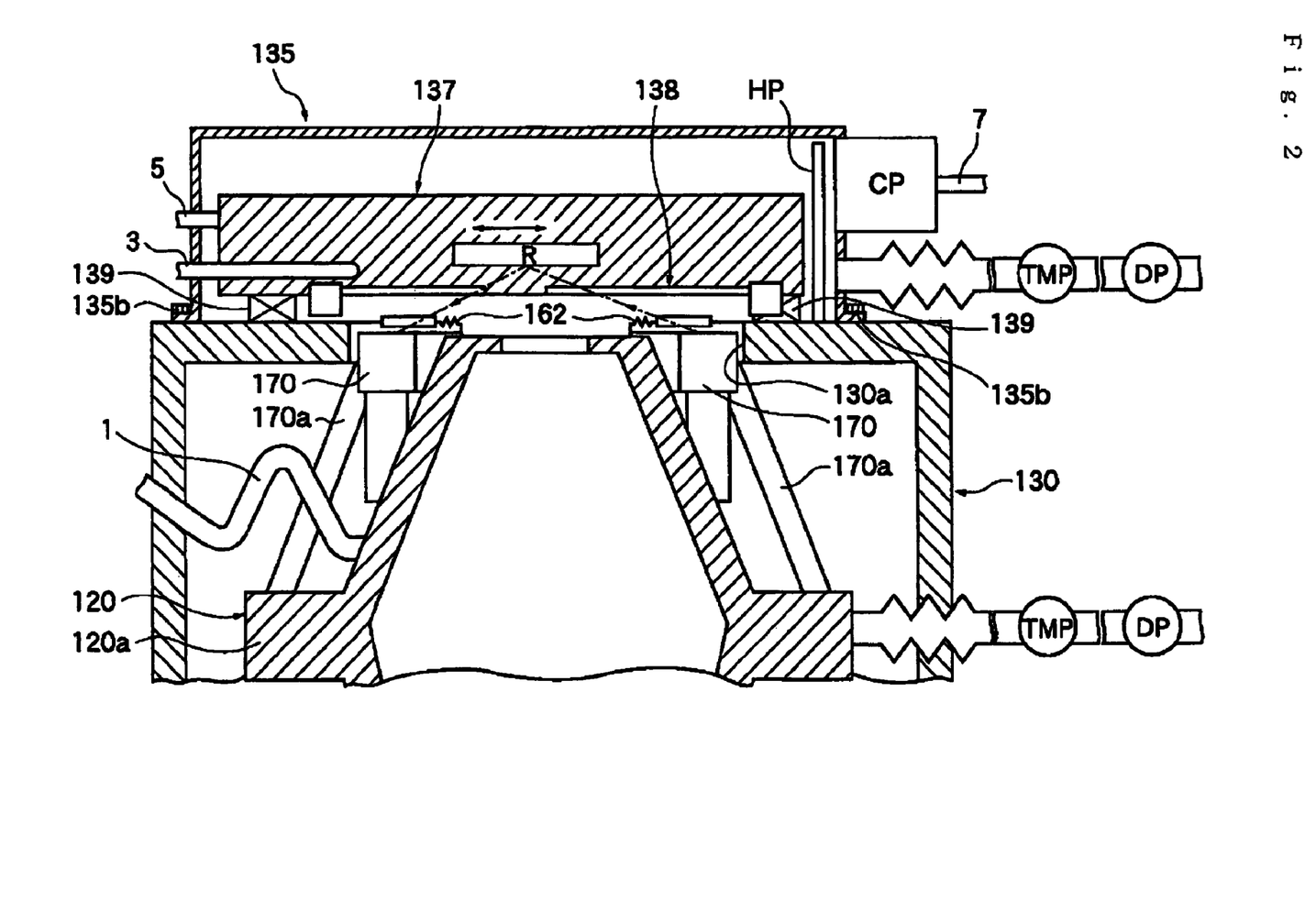
FIG. 2 is a detailed diagram illustrating the construction of the upper part of the exposure apparatus shown in FIG. 1.
Figure 3:
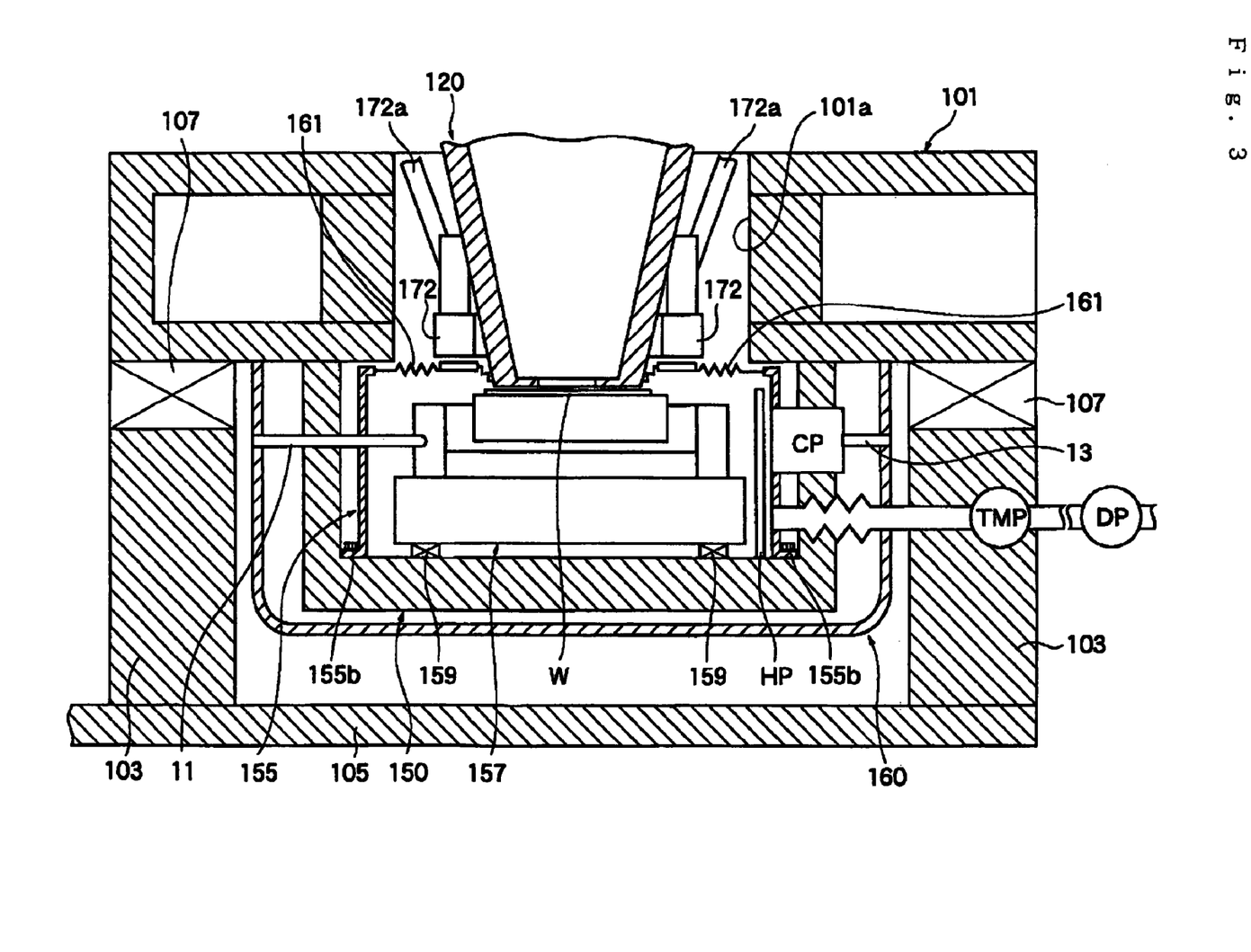
FIG. 3 is a detailed diagram illustrating the construction of the lower part of the exposure apparatus shown in FIG. 1.
Figure 4:
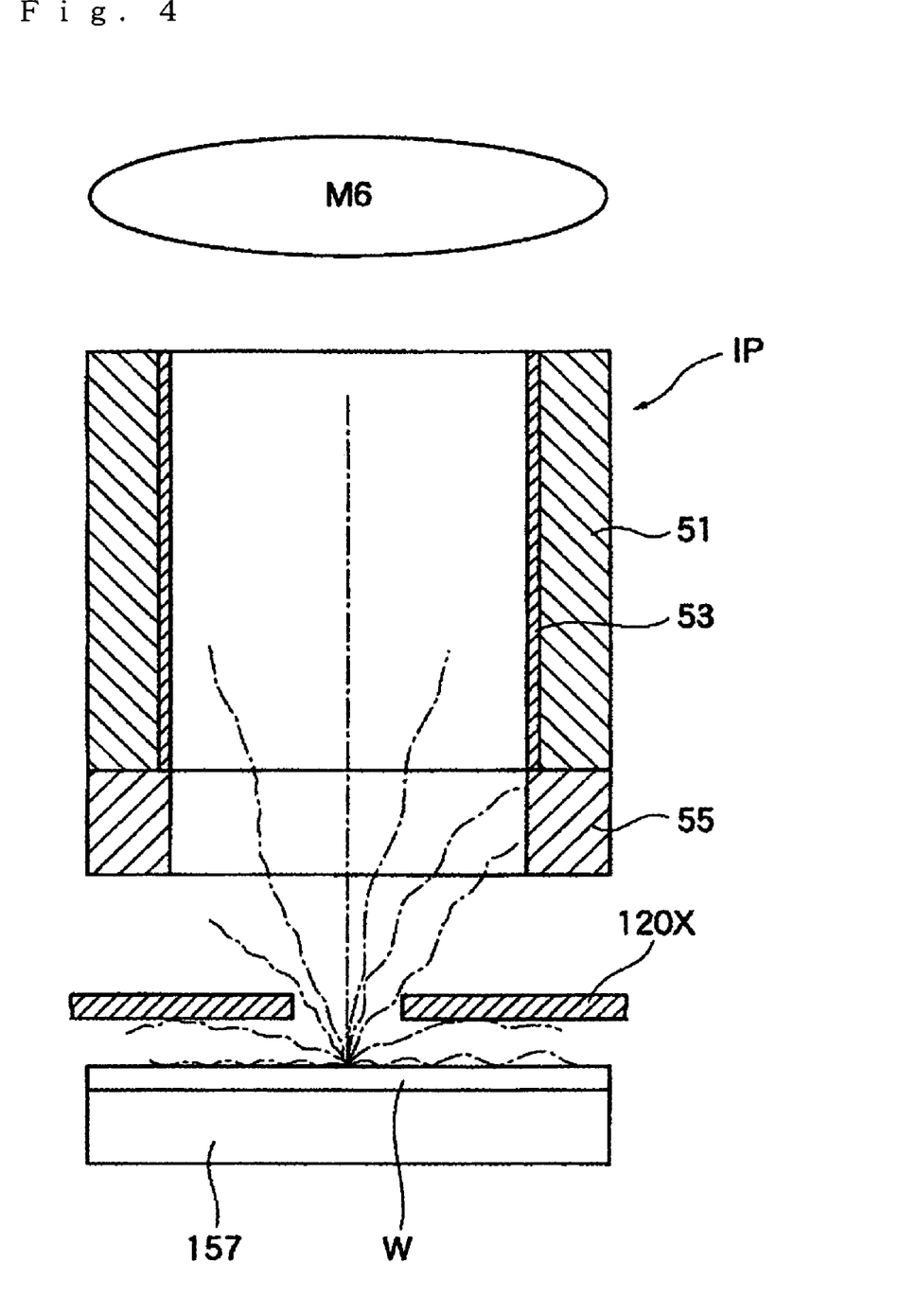
FIG. 4 is a diagram illustrating in model form the construction of the area in the vicinity of the ion pump disposed inside the projection optical system lens barrel of the exposure apparatus shown in FIG. 1.

Working configurations of the present invention will be described in detail below with reference to the figures. FIG. 1 is a sectional view illustrating an example of the mechanical structure of an exposure apparatus constituting one working configuration of the present invention. FIG. 2 is a detailed diagram illustrating the construction of the upper part of the exposure apparatus shown in FIG. 1. FIG. 3 is a detailed diagram illustrating the construction of the lower part of the exposure apparatus shown in FIG. 1. FIG. 4 is a diagram illustrating in model form the construction of the area in the vicinity of the ion pump disposed inside the projection optical system lens barrel of the exposure apparatus shown in FIG. 1.

Furthermore, in the present working configuration, the system will be described using an EUVL exposure apparatus as an example. Although this is not shown in the respective figures, the EUV exposure apparatus comprises an illumination optical system which includes an EUV light source that emits EUV light.

The exposure apparatus 100 shown in these figures comprises a body 101. This body 101 is disposed on a building floor (base plate) 105 via supporting columns 103. Anti-vibration stands (air mounts or the like) 107 are interposed between the undersurface of the body 101 and the upper surfaces of the supporting columns 103. The body 101 is a hollow member; a cavity 101a is formed in the center of this body 101. A circular disk-form lens barrel base 113 is disposed on the circumferential rim of the cavity 101a of the body 101 via anti-vibration stands (air mounts or the like) 111. A supporting leg 115 is disposed between the side part of this lens barrel base 113 and the building floor 105. Anti-vibration devices 117 and 119 are respectively interposed between the side part of the lens barrel base 113 and the upper end of the supporting leg 115, and between the side part of the body 101 and the inside surface of the supporting leg 115.

The lower part of the projection optical system lens barrel 120 is disposed inside the cavity 101a of the body 101. This lens barrel 120 comprises an end part 120a that protrudes from the side surface of the central part. In a state in which the end part 120a is carried on the lens barrel base 113, the lens barrel 120 as a whole is supported by the body 101 and supporting columns 103. Mounts 121 are interposed between the end part 120a of the lens barrel 120 and the lens barrel base 113.

As is shown in the right portions of FIG. 1 and FIG. 2, a turbo molecular pump TMP and a dry pump DP (vibrating type vacuum pump) which are connected in series are connected to this lens barrel 120. The turbo molecular pump TMP is a mechanical pump which performs an exhaust action by causing a thin metal vane assembly (rotor) to rotate at a high speed substantially equal to the speed of molecular motion so that the number of molecules that can pass through on the exhaust side is greater than the number of molecules that can pass through on the intake side. The dry pump DP is a pump which is used to obtain a low vacuum that is free of vapor without using water or oil. The pressure inside the lens barrel 120 is reduced to a specified pressure by the turbo molecular pump TMP and dry pump DP.

A box-form supporting stand 130 is fastened to the upper surface of the body 101. This supporting stand 130 covers the outside of the upper part of the lens barrel base 113 and lens barrel 120. The pressure inside the supporting stand 130 is reduced to a pressure of approximately $10^{-2}$ to $10^{-1}$ Pa. As is shown clearly in FIG. 2, the lower end of a reticle chamber 135 (inner chamber) is fastened to the upper surface of the supporting stand 130 by bolts 135b. A reticle stage device 137 which moves and positions a reticle R by electrostatic adhesion is disposed inside this reticle chamber 135.

This reticle stage device 137 is disposed on the upper surface of the supporting stand 130 via mounts 139. As is shown clearly in FIG. 2, the upper end of the supporting stand 130 is connected to the upper end of the lens barrel 120 via bellows 162 inside the reticle chamber 135. A blind device 138 is installed on the undersurface of the reticle stage device 137. This blind device 138 is used to limit the exposure region of the reticle R.

As is shown in the right portions of FIGS. 1 and 2, a cryo pump CP (vibration-free type vacuum pump) and a turbo molecular pump TMP/dry pump DP (vibrating type vacuum pump) are connected in parallel to the reticle chamber 135. The cryo pump CP is an accumulating vacuum pump that condenses and captures gas molecules on an ultra-low-temperature surface. The gas molecules inside the reticle chamber 135 are condensed and captured by this cryo pump CP. It is desirable that a pulse tube type pump be used as this cryo pump. Meanwhile, the turbo molecular pump TMP/dry pump DP is similar to that described above; the pressure inside the reticle chamber 135 is reduced to approximately $10^{-4}$ Pa by this turbo molecular pump TMP/dry pump DP.

A heat panel HP is installed in an upright attitude in a position facing the cryo pump CP inside the reticle chamber 135. The surface of this heat panel HP on the side of the reticle stage device 137 is a mirror finish metal surface. The radiation of the heat of cooling from the cryo pump CP toward the reticle stage device 137 can be blocked by the heat panel HP.

Inside the reticle chamber 135, a hole 130a is formed in the upper surface of the supporting stand 130. The upper end of the lens barrel 120 is disposed inside this chamber hole 130a. The upper end of the lens barrel 120 is positioned directly beneath the blind device 138 inside the reticle chamber 135. As is shown in FIG. 1, the outsides of the supporting stand 130 and reticle chamber 135 are further covered by an upper vacuum chamber (outer chamber) 140. This upper vacuum chamber 140 has a box-form shape, and is fastened to the upper surface of the body 101. As is shown in the right portion of FIG. 1, the turbo molecular pump TMP/dry pump DP is connected to the upper vacuum chamber 140. This turbo molecular pump TMP/dry pump DP is also similar to that described above, and the pressure inside the upper vacuum chamber 140 is reduced to a specified pressure by this pump A box-form supporting stand 150 is fastened to the undersurface of the body 101. A wafer chamber 155 (inner chamber) is further disposed inside this supporting stand 150. As is shown clearly in FIG. 3, the lower end of the wafer chamber 155 is fastened to the inside bottom surface of the supporting stand 150 by bolts 155b. A wafer stage device 157 which carries, moves and positions a wafer W is disposed inside this wafer chamber 155. This wafer stage device 157 is disposed on the upper surface of the supporting stand 150 via mounts 159.

As is shown in the right portions of FIGS. 1 and 3, a cryo pump CP and a turbo molecular pump TMP/dry pump DP are connected in parallel to the wafer chamber 155. The cryo pump CP is similar to that described above; the gas molecules inside the wafer chamber 155 are condensed and captured on an ultra-low temperature surface. Meanwhile, the turbo molecular pump TMP/dry pump DP is also similar to that described above; the pressure inside the wafer chamber 155 is reduced to approximately $10^{-4}$ Pa by this pump. Inside the wafer chamber 155, a heat panel HP is installed in an upright attitude in a position facing the cryo pump CP. This heat panel HP is also similar to that described above; radiation of the heat of cooling from the cryo pump CP is blocked by this heat panel.

As is shown clearly in FIG. 3, the upper end of the wafer chamber 155 is connected to the lower end of the lens barrel 120 via bellows 161 inside the supporting stand 150. The lower end of the lens barrel 120 is positioned directly above the wafer W carried on the wafer stage device 157 inside the wafer chamber 155. The outsides of the supporting stand 150 and wafer chamber 155 are further covered by a lower vacuum chamber 160 (outer chamber). This lower vacuum chamber 160 has a box-form shape, and is fastened to the undersurface of the body 101. Like the pressure inside the upper vacuum chamber 140 described above, the pressure inside this lower vacuum chamber 160 is also reduced to a specified pressure.

As is shown in FIG. 1, stage metrology rings 171 and 172 are respectively disposed in the vicinity of the upper end of the lens barrel 120 inside the supporting stand 130, and in the vicinity of the lower end of the lens barrel 120 inside the hole 101a of the body 101. These rings 171 and 172 are respectively supported by legs 171a and 172a that extend from the lens barrel base 113. The rings 171 and 172 are frame members to which a measuring instrument that measures the relative positions of the lens barrel 120, reticle stage device 137 and wafer stage device 157 is attached.

The projection optical system lens barrel 120 of the present working configuration is a 6-element projection optical system comprising 6 mirrors M1 through M6 (see FIG. 1; only the sixth mirror M6 is shown in FIG. 4). Furthermore, the respective mirrors M1 through M6 actually consist of mirror holders and mirror main bodies; however, this is not shown in the figures. Numbers are assigned to the respective mirrors M1 through M6 in order from the upstream side. The EUV light (indicated by the one-dot chain line in FIG. 1) that is emitted from the illumination optical system (not shown in the figures) is reflected by the reticle R, and is then successively reflected by the first through sixth mirrors M1 through M6 inside the lens barrel 120, so that this light reaches the surface of the wafer W.

Inside the lens barrel 120, an ion pump IP is disposed between the fifth mirror M5 and sixth mirror M6. As is shown clearly in FIG. 4, the ion pump IP has a tubular magnet 51 which has an absorber 53 on the inside surface; this ion pump IP ionizes the gas and implants this gas in the absorber 53 on the inside of the magnet 51. Furthermore, the ion pump IP absorbs the ionized gas and exhausts this gas. An ionizing device 55 is installed on the lower end of this ion pump IP.

When the resist on the wafer W is irradiated with EUV light, contamination is generated by a chemical reaction. If this contamination is released into the projection optical system lens barrel 120 and adheres to the mirrors, a drop in the reflectivity of the mirrors and the like may occur. In the present working configuration, the contamination is ionized by the ionizing device 55, and this ionized contamination is absorbed by the ion pump IP, so that the adhesion of such contamination to the mirrors can be reduced. Furthermore, in cases where the contamination already carries an electric charge, the contamination can also be absorbed by a magnetic field using the cryo pump described above instead of the ion pump IP.

As is shown in FIGS. 1 through 3, the exposure apparatus 100 has a plurality of sets of piping 1, 3, 5, 7, 11 and 13 that extend to the outside from the interior of the apparatus. The piping 1 extends to the outside of the apparatus from the upper part of the lens barrel 120 in the left portion of the figures. This piping 1 is a vacuum exhaust pipe that is used to evacuate the interior of the lens barrel 120. The piping 3 extends to the outside of the apparatus from the blind device 138. This piping 3 is a pipe that accommodates the electrical cable or the like of the blind device 138. The piping 5 (11) extends to the outside of the chamber from the reticle stage device 137 (wafer stage device 157). This piping 5 (11) is a pipe that accommodates the electrical cable or the like of the stage device. The piping 7 (13) extends to the outside of the chamber from the cryo pump CP of the reticle chamber 135 (wafer chamber 155). This piping 7 (13) is a vacuum exhaust pipe that evacuates the interior of the chamber.

These respective sets of piping consist of a thin soft pipe material. By using piping consisting of such a material, it is possible to reduce the force and vibration applied to the chambers 135 and 155 from the piping. Accordingly, since deformation and vibration of the chambers 135 and 155 can be reduced, the precision of the stage devices 137 and 157 can be ensured to a much greater degree.

Furthermore, as a result of the use of a double shell structure of the chambers such as that of the present working configuration, the internal and external pressure difference of the piping between the reticle chamber 135 and upper vacuum chamber 140, and between the wafer chamber 155 and lower vacuum chamber 160, is small; accordingly, conditions such as crushing due to a differential pressure can be avoided even if the piping 7 and 13 used as vacuum exhaust pipes consists of a thin soft pipe material. Moreover, since the use of such a pipe material is possible, the degree of freedom in piping layout design inside the apparatus is increased, so that desired apparatus specifications can be realized more easily.

In addition, in the case of an exposure apparatus 100 which has such a double shell structure of the chambers, the differential pressure between the inside and outside of the reticle chamber 135 and wafer chamber 155 can be caused to approach zero both during the application of a vacuum and when there are fluctuations in the atmospheric pressure. Accordingly, the system can be devised so that deleterious effects of the deformation of the chambers 135 and 155 are not exerted on components such as the stage devices 137 and 157, thus making it possible to ensure the precision of the stage devices 137 and 157 or the like.

In the operation of the exposure apparatus 100, only the cryo pump CP (vibration-free type vacuum pump) is operated during the exposure operation and alignment of the apparatus, and the turbo molecular pump TMP/dry pump DP (vibrating type vacuum pump) is stopped. Meanwhile, during non-exposure or start-up of the apparatus, the interiors of the upper and lower vacuum chambers 140 and 160 are evacuated to a vacuum state by the turbo molecular pump TMP/dry pump DP. In this way, the transmission of vibration from the vibrating type vacuum pump during the exposure operation and alignment of the exposure apparatus 100 can be blocked, so that the precision of the stage devices 137 and 157 can be ensured to a much greater degree, and so that any deterioration in the exposure performance can be greatly reduced.

Furthermore, the body 101 of the exposure apparatus 100 of the present working configuration shown in FIG. 1 is supported in an anti-vibration manner on the building floor (base plate) 105 by anti-vibration stands 107, 117 and 119. Moreover, the lens barrel 120 is supported in an anti-vibration manner on the body 101 by an anti-vibration stand 111 and mounts 121. Accordingly, vibration of the respective mirrors M1 through M6 inside the lens barrel 120 can be reduced, and deterioration in the measurement precision can be reduced; in this way as well, any deterioration in the exposure performance can be greatly reduced.

Another working configuration of the present invention will be described below with reference to FIGS. 5 and 6. In the following description, abbreviated drawings are used as FIGS. 5 and 6 in order to emphasize the characterizing parts of the present invention; however, in the case of FIG. 5, the detailed mechanical construction is the same as that shown in FIG. 1. Accordingly, in FIGS. 5 and 6, constituent elements corresponding to the constituent elements shown in FIG. 1 are labeled with the same symbols.

Figure 5:
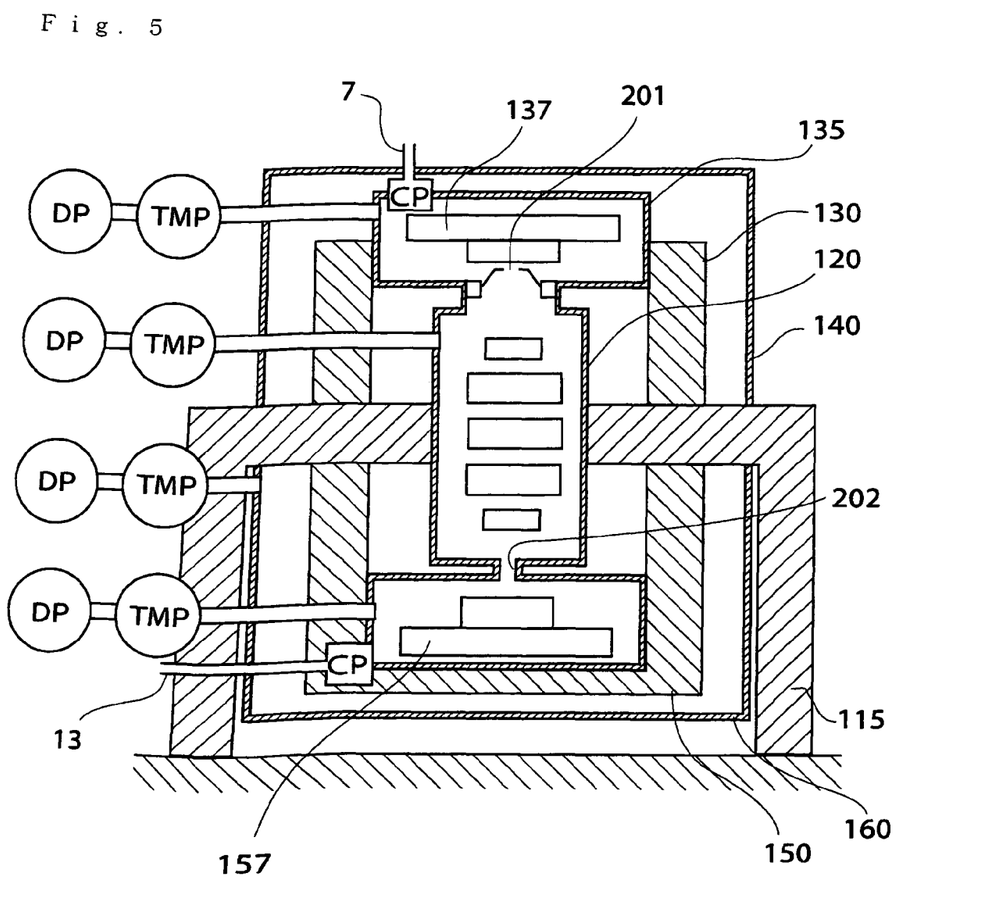
FIG. 5 is an abbreviated diagram illustrating the exposure apparatus shown in FIG. 1, with an emphasis on the essential parts of the present invention.

As is shown in FIG. 5, the exposure apparatus shown in FIG. 1 has an upper vacuum chamber 140 and a lower vacuum chamber 160 which are outer chambers supported on supporting legs 115 (the upper vacuum chamber 140 and lower vacuum chamber 160 communicate with each other). Furthermore, a projection optical system lens barrel 120 is supported on the supporting legs 115, and supporting stands 130 and 150 are also supported on these supporting legs 115. A reticle stage device 137 is supported on the supporting stand 130, and a wafer stage device 157 is supported on the supporting stand 150. The reticle stage device 137 is accommodated inside a reticle chamber 135, and the wafer stage device 157 is accommodated inside a wafer chamber 155.

An exhaust means in which a line consisting of a turbo molecular pump TMP and a dry pump DP connected in series (vibrating type vacuum pump) and a line consisting of a cryo pump (vibration-free type vacuum pump) are connected in parallel is installed inside the outer chambers, reticle chamber 135 and wafer chamber 155. These pumps perform separate exhaust functions.

Furthermore, the low-conductance aperture 201 in FIG. 5 corresponds to the narrow communicating part between the projection optical system lens barrel 120 and reticle chamber 135 in FIG. 1, and the low-conductance aperture 202 corresponds to the narrow communicating part between the projection optical system lens barrel 120 and wafer chamber 155 in FIG. 1. These communicating parts are set at the minimum size in the range required for the exposure apparatus. The bellows and anti-vibration stands shown in FIG. 1 are omitted in FIG. 5. Moreover, the five rectangular shapes shown inside the projection optical system lens barrel 120 indicate the optical system such as mirrors in abbreviated form.

Thus, in the exposure apparatus shown in FIG. 5 (FIG. 1), exhaust means in which a turbo molecular pump TMP/dry pump DP and a cryo pump CP are connected in parallel are separately installed in the respective vacuum chambers; accordingly, the number of pumps is greatly increased.

Furthermore, in exhaust means constructed in this manner, it appears that the following problems arise:

First of all, since the turbo molecular pump TMP is installed outside the outer chambers, the piping between the turbo molecular pump TMP and the projection optical system lens barrel 120, reticle chamber 135 and wafer chamber 155, which are inner chambers, is lengthened, so that the conductance of the piping is correspondingly lowered, thus causing a drop in the effective exhaust rate of the turbo molecular pump TMP. The conductance can be increase by increasing the diameter of the piping in order to increase the effective exhaust rate; if this is done, however, the vibration transmission rate is increased, so that the vibration of the turbo molecular pump TMP is transmitted to the inner chambers.

Secondly, the vibration of the dry pump DP is transmitted to the inner chambers via the turbo molecular pump TMP. As was described above, this problem is not a major problem in cases where only the turbo molecular pump TMP is operated during the exposure operation and during alignment. However, there are cases where such operation is not possible, and cases where it is undesirable to apply vibration to these inner chambers even at times other than during the exposure operation or during alignment. Such a problem can be solved by applying vibration insulating countermeasures between the dry pump DP and turbo molecular pump TMP so that the transmission of vibration of the dry pump DP to the inner chambers is avoided; in this case, however, there is a possibility that problems such as leakage and a lowering of the conductance will arise separately.

Figure 6:
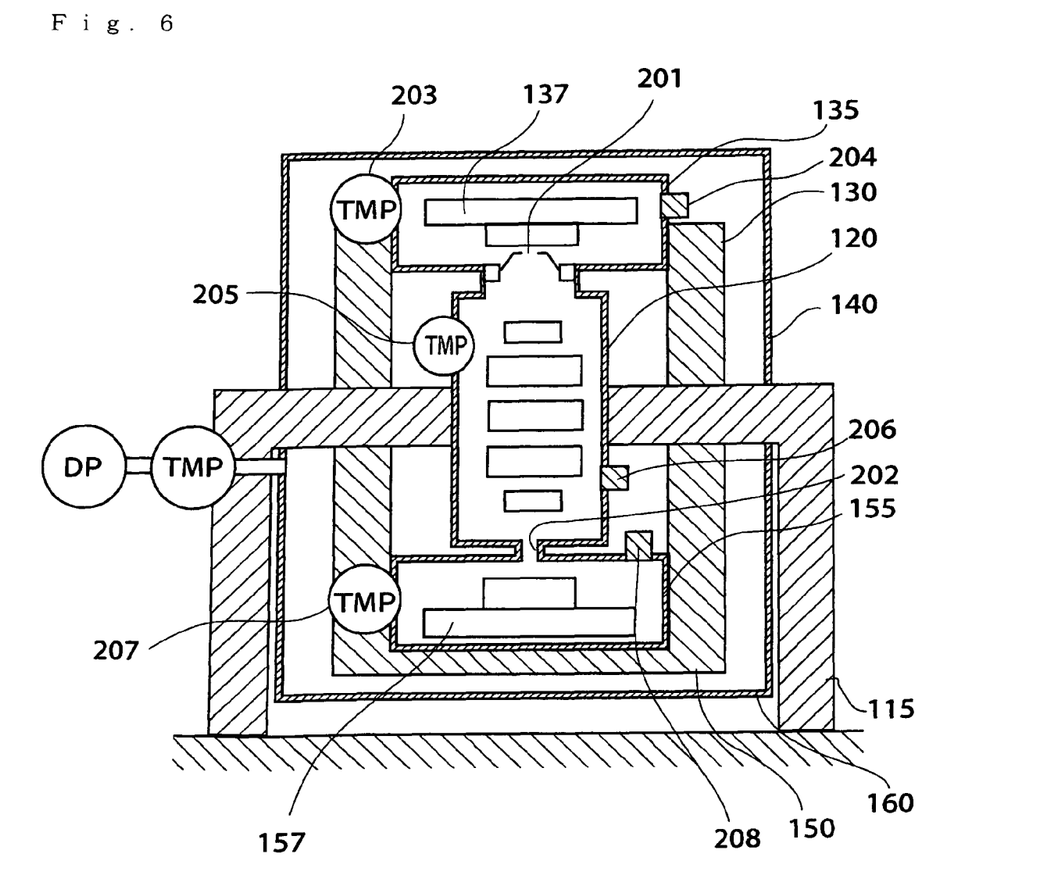
FIG. 6 is an abbreviated diagram (corresponding to FIG. 5) of an exposure apparatus constituting another working configuration of the present invention.

The working configuration shown in FIG. 6 is a working configuration that avoids such problems. Specifically, in this working configuration, note is taken of the fact that in high-performance pumps typified by recent turbo molecular pumps TMPs, a conspicuous reduction in vibration (e.g., 100 nm or less or even 10 nm or less at 100 Hz or less, and 1 nm or less in the case of even higher performance) has become possible as a result of the development of magnetic bearing control and the like.

Specifically, as is shown in FIG. 6, an exhaust means in which a turbo molecular pump TMP and a dry pump DP are connected in series is installed only in an outer vacuum chamber consisting of an upper vacuum chamber 140 and a lower vacuum chamber 160, a turbo molecular pump 203 and an opening-and-closing valve 204 are installed between the reticle chamber 135 and outer chamber, a turbo molecular pump 205 and an opening-and-closing valve 206 are installed between the projection optical system lens barrel 120 and the outer chamber, and a turbo molecular pump 207 and an opening-and-closing valve 208 are installed between the wafer chamber 155 and outer chamber (furthermore, in FIG. 6, the spaces between the insides and outsides of the supporting stands 130 and 150 appear to be separated; however, since the supporting stands 130 and 150 are not separating walls, these spaces are connected, and both form inside spaces of the outer chambers).

First, prior to the initiation of the operation of the exposure apparatus shown in FIG. 6, the opening-and-closing valves 204, 206 and 208 are opened, so that the outer chambers, reticle chamber 135, projection optical system lens barrel 120 and wafer chamber 155 are caused to communicate with each other. Then, the turbo molecular pump and dry pump DP in the exhaust means of the outer chambers are operated so that the gas inside the outer chambers, reticle chamber 135, projection optical system lens barrel 120 and wafer chamber 155 is evacuated as a body, thus heightening the degree of vacuum inside these chambers.

When the degree of vacuum has been heightened to a specified degree of vacuum (e.g., when the degree of vacuum has reached several Torr), the opening-and-closing valves 204, 206 and 208 are closed, so that the outer chambers, reticle chamber 135, projection optical system lens barrel 120 and wafer chamber 155 are formed into independent chambers. Then, the operation of the turbo molecular pumps 203, 205 and 207 is initiated, so that the gas in the reticle chamber 135, projection optical system lens barrel 120 and wafer chamber 155 is respectively evacuated into the outer chambers by these turbo molecular pumps. Specifically, the gas in the reticle chamber 135, projection optical system lens barrel 120 and wafer chamber 155 is temporarily evacuated into the spaces on the outside of these chambers and the inside of the outer chambers by the respective turbo molecular pumps 203, 205 and 207, and is then evacuated into the atmosphere by the turbo molecular pump TMP.

In the working configuration shown in FIG. 6, as is seen from a comparison of FIGS. 5 and 6, the number of dry pumps DP is reduced from 4 to 1, and the cryo pump CP is eliminated. Furthermore, the distance between the turbo molecular pump and the reticle chamber 135, projection optical system lens barrel 120 and wafer chamber 155 is almost completely eliminated; accordingly, the problem of piping conductance mentioned above can be solved. Moreover, since no dry pump is used in the exhaust means of the reticle chamber 135, projection optical system lens barrel 120 and wafer chamber 155, the transmission of the vibration of such pumps to these chambers can be prevented. Furthermore, in the present working configuration, the turbo molecular pump TMP connected to the dry pump DP in FIG. 1 can also be omitted.

The pump used as a low-vibration type vacuum pump may be selected and used as appropriate, as long as this pump is a pump generating an amount of vibration that will not be a problem in the apparatus used.

The invention claimed is:

1. A vacuum apparatus comprising:
a plurality of components that are operated in a vacuum,
a plurality of inner chambers that respectively accommodate the plurality of components,
bellows that connect the respective inner chambers,
an outer chamber that accommodates the plurality of inner chambers as a whole, and
a plurality of exhaust mechanisms installed in the inner chambers and the outer chamber, respectively,
wherein each of the exhaust mechanisms installed in the inner chambers includes a vibration-free type vacuum pump and a vibrating type vacuum pump connected in parallel.

2. The vacuum apparatus according to claim 1, further comprising piping that runs to the outside of the apparatus from the inner chambers, wherein portions of the piping that reach the outer chamber from the inner chambers comprise a thin, flexible piping material.

3. The vacuum apparatus according to claim 1, wherein at each of the inner chambers, the respective component accommodated in the inner chamber and the vibration-free type vacuum pump installed in the inner chambers are positioned so as not to face each other, a heat-blocking plate is disposed between the component and the vibration-free type vacuum pump, and a surface of the heat-blocking plate on a side of the component is a mirror-finish metal surface.

4. A method for operating the vacuum apparatus according to claim 1, wherein only the vibration-free type vacuum pumps are operated during the operation of the components.

5. An exposure apparatus comprising:
a lens barrel which accommodates a projection optical system that projects a pattern on an original plate onto a sensitive substrate,
an original plate stage which moves and positions the original plate,
a sensitive substrate stage which moves and positions the sensitive substrate,
a plurality of inner chambers which respectively accommodate the original plate stage and the sensitive substrate stage,
bellows which connect the respective inner chambers and the lens barrel,
an outer chamber which accommodates the plurality of inner chambers and the lens barrel, and
a plurality of exhaust mechanisms installed in the inner chambers and the outer chamber, respectively,
wherein each of the exhaust mechanisms installed in the inner chambers includes a vibration-free type vacuum pump and a vibrating type vacuum pump connected in parallel.

6. The exposure apparatus according to claim 5, further comprising a contamination removal mechanism installed in the lens barrel.

7. The exposure apparatus according to claim 5, further comprising:
   a body that supports the lens barrel, the original plate stage and the sensitive substrate stage on a floor,
   a stage measurement reference device attachment member that is supported on the body, and
   an anti-vibration stand that is installed at least between the body and the floor or between the body and the lens barrel.

8. A method for operating the exposure apparatus according to claim 5, wherein only the vibration-free type vacuum pumps are operated during an exposure operation and alignment of the exposure apparatus.

* * * * *